United States Patent [19]

Rose et al.

[11] Patent Number: 4,914,633

[45] Date of Patent: Apr. 3, 1990

[54] SELF-TIMED PROGRAMMABLE LOGIC ARRAY WITH PRE-CHARGE CIRCUIT

[75] Inventors: Robert Rose, Hudson; Jash Patel, Marlboro, both of Mass.

[73] Assignee: Digital Equipment Corporation, Maynard, Mass.

[21] Appl. No.: 288,671

[22] Filed: Dec. 22, 1988

Related U.S. Application Data

[63] Continuation of Ser. No. 165,456, Mar. 1, 1988, Pat. No. 4,794,570, which is a continuation of Ser. No. 881,079, Jul. 2, 1986, abandoned.

[51] Int. Cl.$^4$ ............................................. G11C 13/00
[52] U.S. Cl. .................................... 365/203; 365/206
[58] Field of Search ..................... 365/203, 206, 189.01

[56] References Cited

U.S. PATENT DOCUMENTS 4,644,500  2/1987  Yonezu et al. ....................... 365/181
4,794,570  12/1988  Rose et al. ........................... 365/189

FOREIGN PATENT DOCUMENTS 0174397  8/1984  European Pat. Off. .
0231550  12/1986  European Pat. Off. .

OTHER PUBLICATIONS

IEEE Journal of Solid-State Circuits, vol. SC-16, No. 2, Apr. 1981, pp. 103-107, New York, U.S.; C. M. Lin: "A 4 mum NMOS and Structure PLA".

Primary Examiner—Terrell W. Fears
Attorney, Agent, or Firm—Nutter, McClennen & Fish

[57] ABSTRACT

A programmable logic array includes a decoder section and an encoder section connected by a plurality of minterm conductors. The decoder section receives a plurality of input signals and in response selects appropriate ones of the minterm conductors. The selection of the minterm conductors enable the encoder selection to transmit a plurality of output signal on respective output conductors. The decoder and encoder sections include a plurality of stages, each controlling a minterm conductor and output conductor in response to the input signals and the selection of the minterm conductor. The stages include control transistors that are connected between a node, to which the respective minterm and output conductors are connected, and switches which enable and disable the control transistors. The nodes are initially precharged while the switches disable the respective transistors. After precharge, the switches enable the transistors in the decoder and encoder section respectively. A self timing circuit controls the switches to ensure that the switches are correctly timed.

7 Claims, 1 Drawing Sheet

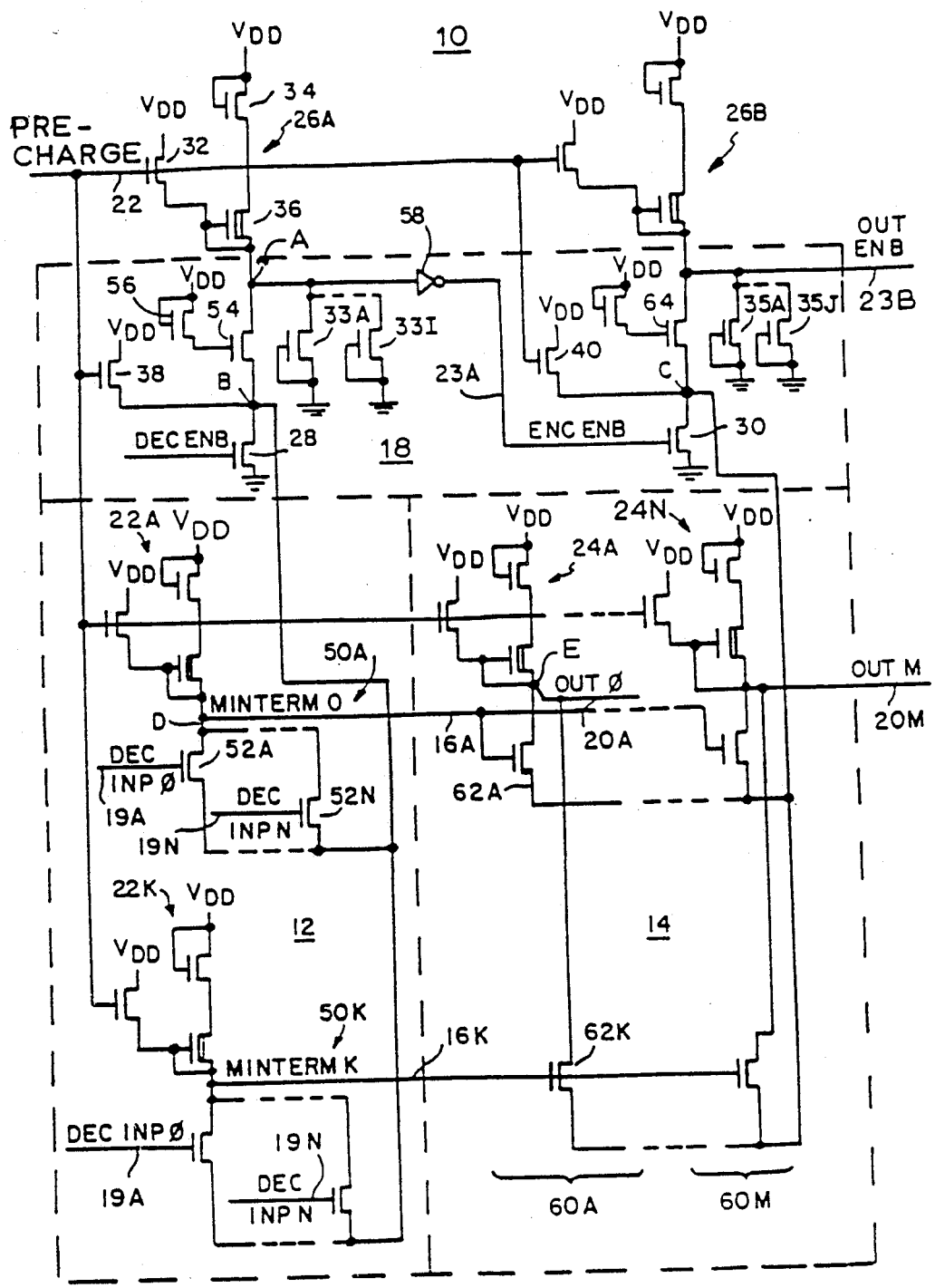

SELF-TIMED PROGRAMMABLE LOGIC ARRAY WITH PRE-CHARGE CIRCUIT

This application is a continuation of Ser. No. 165,456 filed Mar. 1, 1988, now U.S. Pat. No. 4,794,570 which is a continuation of Ser. No. 881,079 filed Jul. 2, 1986, and now abandoned.

BACKGROUND OF THE INVENTION

1. Field of the Invention

The invention relates generally to the field of programmable logic arrays, and more specifically to self-timed programmable logic arrays having precharge circuitry for precharging minterm and output lines prior to decoding of the input signals and encoding of the output signals.

2. Description of the Prior Art

Since digital integrated circuits have been fabricated using large and very large scale integration ("LSI" and "VLSI") circuit techniques, programmable logic arrays have become popular mechanisms for implementing control logic circuits, such as state sequencers and state decoders, as well as a number of circuits previously implemented using combinational logic. A programmable logic array receives a plurality of input signals, and in response to the pattern of asserted and negated input signals, generates a plurality of output signals having a selected pattern of asserted and negated signals. The encoding of the input signals, that is, the particular input signals which are asserted and negated, determines the encoding of the output signals.

A programmable logic array is divided into two sections, or "planes", one functioning as a decoder and the other functioning as an encoder. The two sections are connected by a plurality of conductors, which are termed "minterm" conductors. The decoder section receives the input signals, and, based on their encoding, enables one or several of the minterm conductors. The enabled minterm conductors, in turn, cause the encoder to assert or negate the output signals in a selected pattern.

The circuits comprising the decoder plane operate to perform an AND function to enable each of the minterm conductors. Each AND circuit receives the true or complements of selected input signals. In response to a predetermined encoding, only particular minterm conductors are selected, that is, they have a different condition (high or low voltage level) than do the rest.

The circuits comprising the encoder plane effectively operate to perform an OR function, with each output line being driven by one circuit performing the OR function. The input signals to each OR circuit are the signals on the minterm conductors from the decoder section. When a minterm conductor is selected, the OR circuits connected to that minterm conductor establish the conditions of the output lines.

A primary benefit of using a programmable logic array is that the array typically can have a very regular physical shape on the integrated circuit chip. The input lines to the circuits performing the AND function, which include the true and/or complement of the input signals, and the output bit lines from the OR circuits in an physical implementation of a typical VLSI programmable logic array are all largely disposed in parallel. In addition, the minterm conductors are largely disposed orthogonally to the input and output lines. Each AND circuit is implemented using a plurality of transistors, with one transistor being used for each input signal, or its complement, which controls the minterm conductor. Each transistor is connected between the associated minterm conductor and ground and controlled by the signal on an input (or complement) line.

To speed operation operation of the programmable logic arrays, the minterm conductors and the output bit lines are commonly precharged, that is, they are placed in a selected electrical condition, typically a high voltage condition prior to enabling the AND and OR circuits to operate, which allows the signals to be generated more quickly. In the past, to prevent the input signals from affecting the precharge operation, gates have been placed on the input lines and the minterm conductors between the decoder and encoder sections to disable transmission of the input signals onto the input lines and transmission of the signals over the minterm conductors from the decoder section to the encoder section. However, the addition of the gates effectively distrubs the regular layout of the lines in the programmable logic array. In addition, the additional gates adds delays in the signal paths, which slows the operation of the programmable logic array.

SUMMARY OF THE INVENTION

The invention provides a new and improved programmable logic array which has an improved circuit for initially precharging the minterm conductors and output bit lines and an internal timing circuit for indicating when the output signals are valid and can be used. The timing circuit also facilitates timing within the programmable logic array so that the encoder section is operative after the signal on the appropriate minterm conductor is asserted and valid at the encoder section.

In brief summary, the new programmable logic array includes an input decoder section and an output encoder section, which are interconnected by a plurality of minterm conductors, and an internal timing circuit. Each minterm conductor is controlled by an AND circuit comprising a plurality of transistors each controlled, in turn, by an input signal or its complement. Each minterm conductor also controls a plurality of OR circuits in the encoder section, with each OR circuit also comprising a plurality of transistors each controlling, in turn, an output bit line. Each OR circuit comprises a plurality of transistors each controlling one output bit line. The programmable logic array also includes a circuit for precharging the minterm conductors and the output bit lines. During the precharge operation, transistor switches maintain the transistors comprising the AND and OR circuits in the decoder and encoder sections in a disabled condition to allow precharge to be accomplished quickly.

The internal timing circuit includes two sections, one timing the decoder section and the other timing the encoder section. The two sections are connected by a timing conductor. An enabling signal is received which turns on the transistor switch controlling the decoder section, which switch also controls the decoder timing section. A predetermined time later, the decoder timing section generates an enabling signal which turns on the transistor switch which controls the encoder section, which switch also controls the encoder timing section. The encoder timing section generates an output enabling signal a predetermined time later to enable downstream circuitry to use the output signals from the programmable logic array.

The delay between the receipt of the enabling signal and the generation of the transmitted enabling signal by each timing section is related to the time required for the corresponding decoder and encoder section to generate the signals on the minterm and output conductors and transmit them to the succeeding section or the downstream circuitry. The delay in each timing section is governed by a resistance-capacitance circuit with the capacitance provided by a plurality of parallel-connected transistors, the number of transistors corresponding to the maximum number of transistors connected to a minterm conductor or output bit line in the associated decoder or encoder circuit.

BRIEF DESCRIPTION OF THE DRAWING

This invention is pointed out with particularity in the appended claims. The above and further advantages of this invention may be better understood by referring to the following description taken in conjunction with the accompanying drawing, which depicts a circuit diagram of a programmable logic array constructed in accordance with the invention.

DETAILED DESCRIPTION OF AN ILLUSTRATIVE EMBODIMENT

With reference to the drawing, a programmable logic array 10 constructed in accordance with the invention includes a decoder section 12 connected to an encoder section 14 through a plurality of minterm conductors 16A through 16K. The decoder section operates in response to DEC INP O through DEC INP N decode input signals that are received on input lines 19A through 19N. Each decode input signal DEC INP O through DEC INP N represents the true or complement of one of the input signals INP O through X (not shown) that are coupled to the programmable logic array by upstream circuitry (also not shown), to enable the generation of output signals OUT O through OUT M in response thereto.

The decoder section 12, in response to a particular encoding of the decode input signals DEC INP O through DEC INP N, selects the appropriate minterm conductors 16A through 16K. That is, one or several of the minterm conductors 16A through 16K are selected in response to the pattern of assertions of the DEC INP O through DEC INP N decode input signals, which represents a corresponding pattern of assertions and negations of the associated INP O through X input signals from the upstream circuitry. As is often the case in a programmable logic array, a minterm conductor may be selected regardless of the condition of one or more of the input signals; those signals are termed "don't care" signals. The selection of a minterm conductor enables the encoder section to generate a plurality of output signals OUT O through OUT M on output bit lines 20A through 20M, with the output signals having a selected encoding of asserted and negated signals. The OUT O through OUT M output signals may be used for controlling downstream circuitry (not shown).

The programmable logic array 10 also includes a self-timing circuit 18 which performs several functions. First, the self-timing circuit 18 disables both the decoder section 12 and the encoder section 14 during a precharge phase that is initiated by a PRECHARGE signal on a line 22. During the precharge phase, the minterm conductors 16A through 16K and output conductors 20A through 20M are charged to a high voltage level for the succeeding phases. Following the precharge phase, in response to a DEC ENB decode enable signal, the self-timing circuit enables the decoder section 12 to select appropriate minterm conductors 16A through 16K in response to the DEC INP O through N decode input signals. During this time the self-timing circuit 18 maintains the encoder section 14 in a disabled condition.

After the minterm conductors have been selected and the appropriate signals have been transmitted to the encoder section 14 and allowed to settle, the self-timing circuit 18 generates an ENC ENB encode enable signal on a line 23A which enables the encoder section 14 to energize selected output bit lines 20A through 20M, as determined by the minterm conductor that is selected, to generate a pattern of the OUT O through OUT M output signals. Finally, the self-timing circuit 18 generates an OUT ENB output enable signal on a line 23B which is transmitted to circuitry (not shown) which is to use the OUT O through OUT M output signals to indicated that those output signals are then valid and can be used.

Each of the minterm conductors 16A through 16K and each of the output bit lines 20A through 20M is precharged through an associated precharge buffer circuit 22A through 22K, for the minterm conductors, and 24A through 24M, for the output bit lines. Precharge buffer circuits 26A and 26B are also provided to precharge lines 23A and 23B in the self-timing circuit 18. The precharge buffer circuits are actuated in response to a PRECHARGE precharge enabling signal to precharge the lines 23A and 23B in the self-timing circuit 18. Since each of the precharge buffer circuits is identical, only precharge buffer circuit 26A will be described in detail.

Preliminarily, during the precharge phase, the DEC ENB decode enable signal and the ENC ENB encode enable signal are both negated, which turns off transistors 28 and 30. Transistors 28 and 30 are operable during the decode and encode phases to enable the decode section 12 and encode section 14, respectively, as described below. Since the PRECHARGE signal is initially negated prior to the precharge phase, a transistor 32 in precharge buffer circuit 26A is turned off. When the PRECHARGE signal is asserted, the transistor 32 is turned on, allowing current to flow from the power supply $V_{dd}$ to the node A in the self-timing circuit 18. The charging of node A serves to charge the drain-to-gate capacitances associated with a plurality of transistors 33A through 33I that are connected to node A. The node A is thus charged to a voltage level approximately that of the power supply, less the voltage drop between the source and drain terminals of the transistor 32. Similarly, the charging performed by precharge buffer circuit 26B also serves to charge the drain-to-gate capacitances associated with a plurality of transistors 35A through 35J. The number of transistors 33A through 33I and 35A through 35J is selected as described below.

At the end of the precharge phase, the PRECHARGE signal is negated, thereby switching off the transistor 32. The precharge buffer circuit 26A includes a direct unswitched path between node A and the power supply through a load transistor 34 and a depletion mode transistor 36. Transistor 36 provides a weak static pull-up for node A to prevent leakage from node A from degrading the voltage level of node A after the precharge phase has been completed and prior to the commencement of the succeeding phases of operation of the programmable logic array. Load transistor 34 operates essentially as a load resistor, and also provides a threshold voltage drop between its drain and source terminals. The voltage drop ensures that the voltage level of node A at most reaches the voltage level of the power supply $V_{dd}$ less the voltage drop between the drain and source terminals of transistor 34. This improves the speed of operation of the circuit during the succeeding phases of operation, as the pull-down devices (for example, transistor 28, as described below) only have to pull down from the lower voltage level, not from the power supply voltage $V_{dd}$. As explained below, however, when transistor 28 is turned on during the phase after precharge, transistors 34 and 36 are unable to maintain the node A at a high voltage level.

Self-timing circuit 18 also includes transistors 38 and 40 which are connected between the power supply $V_{dd}$ and the drain terminals of transistors 28 and 30 at nodes B and C, respectively. During the precharge phase, the gates of transistors 38 and 40 are energized by the PRECHARGE signal to enable the transistors to precharge the nodes B and C, respectively.

The decoder section 12 includes a plurality of stages 50A through 50K, each of which is connected to and, during the decode section evaluation phase, controls one of the minterm conductors 16A through 16K. Each stage is similar, and so only stage 50A will be described in detail. Stage 50A includes a plurality of transistors 52A through 52N connected in parallel between a node D, to which the precharge buffer circuit 22A and minterm conductor 16A are also connected, and node B in the self-timing circuit 18. Each of the transistors 52A through 52N is controlled by one of the DEC INP O through N decode input signals. As is conventional, the transistors in stages 50A through 50K may not receive all of the DEC INP O through N signals; the selection of the DEC INP O through N signals which are received in any one stage will be made clear below.

Prior to the decode phase, the ones of the DEC INP O through DEC INP N signals which control the stage are applied to the transistors 52A through 52N. If any of the applied DEC INP O through signals is high, the associated transistor 52A through 52N is in the enabled condition, but, since transistor 28 is then off, the node B is in a high voltage condition, and so none of the transistors are actually turned on, or conducting. When the transistor 28 is turned on in response to the DEC ENB signal during the decode phase, the transistors 52A through 52N that are enabled by the respective DEC INP signal are turned on.

If any of the transistors 52A through 52N are turned on during the decode phase, the node D is discharged to ground through the transistor 28, pulling the minterm conductor 16A to a low voltage level. The stage 50A thus operates to perform a NOR function in response to the DEC INP O through N signals that are coupled to it, pulling the MINTERM O line 16A to a low voltage condition if any of the DEC INP O through DEC INP N decode input signals that are coupled to the stage are high. As is described in C. Mead and L. Conway, Introduction to VLSI Systems, (Addison-Wesley, 1980) pp. 79–82, by the appropriate selection of the association between the true and complement of the INP O through X signals and the DEC INP O through N signals that are coupled to the stage, the stage 50A operates to perform an AND function on a particular encoding of certain of the INP O through X signals. The remaining stages 50B through 50K operate similarly.

When the DEC ENB decode enable signal turns on transistor 28, node A in the self-timing circuit 18 also begins to discharge through a transistor 54. Transistor 54 is biased on by the power supply $V_{dd}$ through a load transistor 56 and effectively operates as a resistor whose resistance depends on the biasing voltage provided by transistor 56. The charge stored in the capacitances of transistors 33A through 33I discharges through the transistor 54 and the enabled transistor 28, and the voltage level at node A falls, at a rate and with a characteristic related to the multiplicative product of the resistance of transistor 54 (assuming that the resistance of transistor 54 is much greater than the effective resistance of transistor 28) and the effective drain-to-gate capacitance of transistors 33A through 33I (which is the sum of the drain-to-gate capacitances of the individual transistors). The voltage level of node A decreases, and as it does, an inverter 58 causes the voltage level of the ENC ENB signal on line 23A to increase. When the voltage level of the ENC ENB encode enable signal reaches a threshold level, at that point transistor 30 begins to turn on.

With reference again to the MINTERM O through K signals on lines 16A through 16K, it will be appreciated that the rates at which the voltage levels of those signals fall are largely governed by the capacitances and resistances of the transistors 52A through 52N in stages 50A through 50K in the decoder section 12. Assuming that all of the transistors 52 have substantially the same structure and electrical characteristics, the stage whose MINTERM signal will be the slowest to fall during a decode phase will be the one with the largest number of transistors 52, and that will occur when only one of the transistors 52 in the stage is turned on by a DEC INP signal. In that case, the sole transistor 52 which is turned on discharges all of the electrical charge that was stored in the capacitances of the other transistors during the precharge phase at a rate determined by the effective resistance of the one transistor that is on, and the sum of the capacitances of the other transistors.

As mentioned above, the rate at which the voltage level of node A decreases, and the comcomitant rate at which the voltage level of the ENC ENB encode enable signal increases, is determined by the combined capacitance of the transistors 33A through 33I and the resistance of transistor 54. The number of transistors 33A through 33I is selected to be the same as the maximum number of transistors 52 in one of the stages 50 in decode section 12, and their physical and electrical characteristics are related to the corresponding characteristics of transistors 52, so that the capacitance at node A due to transistors 33 is directly related to the capacitance of the transistors 52 in the stage whose MINTERM signal takes the longest to drop. In addition, the transistor 54 in self-timing circuit 18 is biased to have an effective resistance somewhat larger than the resistance of any one of the transistors 52. Accordingly, the rise time for the ENC ENB encode enable signal on line 22, that is, the time required for the ENC ENB signal to effectively turn transistor 30 on in self-timing circuit 18, is related to the longest time that would be required for all of the MINTERM signals to fall that are going to fall during the decode phase, and for that MINTERM signal to propagate to the encoder section 14. By the appropriate selection of the resistance of transistor 54 and the drain-to-gate capacitances of transistors 33A through 33I, the rise time for the ENC ENB encode enable signal is slightly greater than the longest time required for all of the MINTERM signals to propagate to encoder section 14.

The encoder section 14 is also constructed of a plurality of stages 60A through 60M each of which controls one of the output bit lines 20A through 20M. The stages are all similar, and only a representative stage 60A, which controls output bit line 20A will be described in detail. Stage 60A includes a plurality of transistors 62A through 62K. All of the drain terminals of transistors 62 are connected to output bit line 20A to form a node E, and all of their source terminals are connected to node C and controlled by transistor 30. The gates of all of the transistors are controlled by a minterm line 16A through 16K, so that the on and off conditions of the respective transistors 62A through 62K are controlled by the respective one of the MINTERM signals. Depending on the required encoding of the OUT O output signal in response to the MINTERM O through K signals, some of transistors 62A through 62K may not be present; if the OUT O signal is high in response to the assertion of a MINTERM signal, a transistor 62A through 62K is not provided for the corresponding minterm line.

Stage 60A operates in a manner similar to the operation of stage 50A described above. During both the precharge phase and the decode phase, transistor 30 in self-timing circuit 18 is off and node C is thus floating above a ground voltage level. Regardless of the condition of the transistors 62 in response to the associated MINTERM signals, after the precharge phase, node E and the OUT O output signal will be at a high voltage level. Immediately after the decode phase, and before the encode phase, the sole MINTERM O through K signals which are at a high voltage level enables the transistors 62A through 62K which are provided. When the ENC ENB encode enable signal turns transistor 30 on, the enabled transistors 62A through 62K are turned on and the voltage level of node E and the OUT O output signal, which had been high due to the precharge, will begin to fall. If no transistor 62 is present at that minterm line, the voltage level of the node E, and thus of the OUT O signal will be unchanged.

It will be appreciated that, by the appropriate selection of the connection of transistors 62A through 62K in each of stages 60A through 60M, the stages 60A through 60M operate to perform an OR operation in controlling the OUT O through M output signals. A transistor 62 is connected between nodes E and C for any MINTERM signal which, when asserted, is to drive the OUT O signal to a low voltage condition, and not transistor 62 is provided if the OUT O signal is to remain in a high voltage condition.

When the ENC ENB encode enable signal turns transistor 30 on, the charge that had been stored in the drain-to-gate capacitances of transistors 35A through 35J also begins to discharge through transistors 64 and 30. The rate at which this occurs determines the rate at which an OUT ENB output enable signal falls. As described above in connection with transistors 33A through 33I and 54 and the ENC ENB encode enable signal on line 23A, by the appropriate selection of the number of transistors 35A through 35J, and their drain-to-gate capacitances, and the effective drain-to-source resistance of transistor 64, the fall time of the OUT ENB signal on line 23B can be made to correspond to the fall times for the OUT O through M signals on lines 20A through 20M. Downstream circuitry (not shown) may use the OUT ENB output enable signal to determine when the OUT O through M signals are valid and can be used.

It will be appreciated by those skilled in the art that the programmable logic array depicted in the drawing and described above avoids the problems of the prior art which required gates in the minterm lines to enable their precharge, thereby allowing for a more simplified and regular layout of the programmable logic array on an integrated circuit chip. During the precharge phase, the transistors 28 and 30 allow the nodes B and C to effectively float, allowing the precharge to occur without having to gate the INP O through INP N signals and the MINTERM A through K signals, which effectively reduces the number of transistors required in the programmable logic array.

The self-timing feature also reduces the amount of external control circuitry required, as it enables the decode, encode, and output phases to be effectively initiated in response to the one DEC ENB decode enable signal which controls transistor 28. Furthermore, by the self-timing feature, the timings of the ENC ENB encode enable and OUT ENB output enable signals are closely related to the generation and validity of the related MINTERM O through K and OUT O through M signals, respectively.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A programmable logic array comprising an input decoder section and an output encoder section connected by a plurality of minterm conductors, said input decoder selecting a minterm conductor in response to the encoding of a plurality of input signals, and the output encoder section transmitting a plurality of output signals each on a respective output bit line and having an encoding determined by the selected minterm conductor, A. said input decoder section including a plurality of decoder stages each connected to a node to which one of said minterm conductors is connected, at least some of said decoder stages including at least one control transistor connected to said respective node for controlling the selection of said minterm conductors under control of an input signal, and a decoder switch means connected to couple current from a decoder switch node in response to a decoder enabling signal, said control transistors in all of said decoder stages being connected to said decoder switch node so that current flows through said control transistors and said decoder switch means in response to said decoder enabling signal; and B. said output encoder section including a plurality of stages each connected to a node to which one of said output conductors is connected, at least some of said stages including at least one control transistor connected to said respective node for controlling the transmission of an output signal on said output conductor in response to the selection of said minterm conductor, and an encoder switch means connected to couple current from an encoder switch node in response to an encoder enabling signal, said control transistors in said encoder stages being connected to said encoder switch node so that current flows through said control transistors and said encoder switch means in response to said encoder enabling signal, said programmable logic array further including precharge means for precharging the respective nodes.

2. A programmable logic array as defined in claim 1 further including timing means connected to said decoder switch means and said encoder switch means for generating said encoder enabling signal after the assertion of said decoder enabling signal.

3. A programmable logic array as defined in claim 2 wherein said timing means includes:
  A. capacitor means connected to a timing node, said capacitor means having a capacitance value selected in relation to the maximum capacitance value of the control transistors in any of said decoder stages,
  B. resistor means connected to said timing node and said decoder switch node;
  C. precharge connection means for connecting said precharge means to said timing node, and
  D. encoder connection means for connecting said timing node to said encoder section to provide said encoder enabling signal, whereby said precharge means precharges said timing node and said capacitor means prior to assertion of said decoder enabling signal, and during assertion of said decoder enabling signal said capacitor means discharges through said resistor means to provide an asserted encoder enabling signal when said capacitor means has discharged to a selected level.

4. A programmable logic array as defined in claim 3 further including encoder timing means connected to said encoder switch means for generating an output enabling signal after the assertion of said encoder enabling signal.

5. A programmable logic array as defined in claim 4 wherein said encoder timing means includes:
  A. encoder capacitor means connected to an encoder timing node, said encoder capacitor means having a capacitance value selected in relation to the maximum capacitance value of the control transistors in any of said encoder stages,
  B. encoder resistor means connected to said encoder timing node and said encoder switch node;
  C. encoder precharge connection means for connecting said precharge means to said encoder timing node; and
  D. output connection means for connecting said timing node to an output terminal to provide said output enabling signal, whereby said precharge means precharges said encoder timing node and said encoder capacitor means prior to assertion of said encoder enabling signal, and during assertion of said encoder enabling signal said encoder capacitor means discharges through said encoder resistor means to provide an asserted output enabling signal when said capacitor means has discharged to a selected level.

6. A programmable logic array as defined in claim 1 further including encoder timing means connected to said encoder switch means for generating an output enabling signal after the assertion of said encoder enabling signal.

7. A programmable logic array as defined in claim 6 wherein said encoder timing means includes:
  A. encoder capacitor means connected to an encoder timing node, said encoder capacitor means having a capacitance value selected in relation to the maximum capacitance value of the control transistors in any of said encoder stages,
  B. encoder resistor means connected to said encoder timing node and said encoder switch node;
  C. encoder precharge connection means for connecting said precharge means to said encoder timing node, and
  D. output connection means for connecting said timing node to an output terminal to provide said output enabling signal, whereby said precharge means precharges said encoder timing node and said encoder capacitor means prior to assertion of said encoder enabling signal, and during assertion of said encoder enabling signal said encoder capacitor means discharges through said encoder resistor means to provide an asserted output enabling signal when said capacitor means has discharged to a selected level.

* * * * *